(12) United States Patent
Morrell (10) Patent No.: US 7,245,485 B1
(45) Date of Patent: Jul. 17, 2007

(54) ELECTRONICS CABINET WITH INTERNAL AIR-TO-AIR HEAT EXCHANGER

(75) Inventor: Edward Albert Morrell, Randolph, NJ (US)

(73) Assignee: UTStarcom, Inc., Alameda, CA (US)

( * ) Notice: Subject to any disclaimer, the term of this patent is extended or adjusted under 35 U.S.C. 154(b) by 288 days.

(21) Appl. No.: 10/989,453

(22) Filed: Nov. 15, 2004

(51) Int. Cl.
*G06F 1/20* (2006.01)

(52) U.S. Cl. ...................... 361/687; 361/688

(58) Field of Classification Search ........ 361/687–692, 361/694–697
See application file for complete search history.

(56) References Cited

U.S. PATENT DOCUMENTS

| | | | | |
|---|---|---|---|---|
| 4,502,099 | A | 2/1985 | Manes et al. ............... | 361/383 |
| 4,648,007 | A | 3/1987 | Garner ....................... | 361/384 |
| 5,297,005 | A | 3/1994 | Gourdine ................... | 361/697 |
| 5,422,787 | A | 6/1995 | Gourdine ................... | 361/697 |
| 6,000,623 | A | 12/1999 | Blatti et al. ................ | 236/49.3 |
| 6,058,712 | A * | 5/2000 | Rajasubramanian et al. | 62/3.6 |
| 6,135,875 | A | 10/2000 | French ....................... | 454/184 |
| 6,269,863 | B1 * | 8/2001 | Wyler ........................ | 165/80.3 |
| 6,301,108 | B1 | 10/2001 | Stockbridge ............... | 361/688 |

OTHER PUBLICATIONS

Jon Zuo, et al., *Advanced Thermal Architecture for Cooling of High Power Electronics*, Thermacore, Inc., 2001, 7 pages.
Nelson J. Gernert, *Cooling Power Semiconductors in Cabinets*, Thermacore International, Inc., Jul. 25, 2001, 6 pages.
Z. J. Zuo, et al., *Compact, Double Side Impingement, Air-to-Air Heat Exchanger*, Thermacore, Inc., (date unknown, circa 2001), 8 pages.

* cited by examiner

*Primary Examiner*—Yean-Hsi Chang
(74) *Attorney, Agent, or Firm*—McDonnell Boehnen Hulbert & Berghoff LLP (57) ABSTRACT

An enclosure has a set of panels forming an outer peripheral skin. A heat exchanger wall is placed within the panels. A first fan arrangement circulates ambient air into a space within the panels and along the exterior surface of the heat exchanger wall and back into the environment. A second fan arrangement circulates air contained within the enclosure against the interior surface of the heat exchanger wall. Heat is transferred through the heat exchanger wall to the ambient air circulated by the first fan. An inner wall is placed adjacent to the interior surface of the heat exchanger wall. The space between the inner wall and the heat exchanger wall forms a space for the air within the interior of the enclosure to circulate by the second fan. The heat exchanger wall provides a barrier isolating the ambient air from the air within the enclosure, preventing dust, humidity and pollutants to enter into the interior of the cabinet in the space surrounding the electronic components.

14 Claims, 11 Drawing Sheets

ELECTRONICS CABINET WITH INTERNAL AIR-TO-AIR HEAT EXCHANGER

BACKGROUND

1. Field of Invention

This invention relates generally to the subject of methods and systems of providing cooling to a cabinet or enclosure. The cooling is needed because the cabinet contains electronic components that generate heat. Such cabinets are used in a variety of devices, for example servers, and switching and routing devices used in telecommunications, and in Telephone Company, Internet service provider, and computer network applications. More particularly, the invention relates to a cabinet design that includes an internal air-to-air heat exchanger and fan arrangement that provides cooling for the cabinet while simultaneously preventing dust, humidity or pollutants from the environment from entering the interior of the cabinet where the electronic components are located. This feature is particularly important in the application of electronics cabinets used in outside environments, such as in the case of some types of switching and networking equipment where the cabinets can be located next to roads, on telephone poles and in other harsh environments.

2. Description of Related Art

Integrated telecommunications devices, such as routers, switches, network access servers, remote access concentrators, TI span termination shelves, DSL access multiplexers, and other similar types of devices, often take the form of a medium or large size enclosure or cabinet. The cabinet, sometimes referred to in the art as a "chassis" or "shelf", typically incorporates one or more printed circuit boards or, more commonly, modular cards, with such cards typically being capable of being manually inserted into and removed from the chassis. These printed circuit boards and/or cards incorporate numerous semiconductor-based electronic components such as microprocessors and integrated circuit chips, which generate significant amounts of heat during operation.

Integrated circuit chips, microprocessors, and other similar electronic components are designed to operate within a particular temperature window. Accordingly, the heat generated by such components must be removed from the enclosure they are housed in or else the components will overheat and fail. It is known in the art to provide air flow features by which relatively cooler ambient air is conducted into the chassis, and relatively warmer air generated inside the chassis is exhausted from the chassis though an aperture in the chassis housing, typically using one or more fans. Representative patents addressing cooling and air flow considerations within an electronics device include the following references: Manes, U.S. Pat. No. 4,502,099, Garner, U.S. Pat. No. 4,648,007 and the patents to Gourdine, U.S. Pat. Nos. 5,297,005 and 5,422,787. Gourdine's patents describe a cabinet or chassis in which one or more electronic components are individually isolated and subject to separate airflow in order to maximize the cooling of all the components in the cabinet. The patent to Stockbridge, U.S. Pat. No. 6,301,108, describes a chassis cooling arrangements using ambient air as well as a safety feature in the form of a fire-containment trap door that closes off the ambient air passages in the event of a fire in the chassis.

Cooling arrangements for electronics cabinets using separate air-to-air heat exchangers are known in the art and such products are available from Thermacore. See, for example the following papers: Jon Zuo, Ron Hoover and Fred Phillips, "Advanced Thermal Architecture for Cooling of High Power Electronics", Thermacore International, Inc., 2001; Nelson J. Gernert, "Cooling of Power Semiconductors in Cabinets", Thermacore International, Inc., 2001; and, Z. J. Zuo, E. H. Dubble and S. D. Garner "Compact, Double Side Impingement, Air-To-Air Heat Exchanger", Thermacore, Inc., undated, all of which are available from the Thermacore.com website. A separate air-to-air heat exchanger, such as the HXi Series air-to-air heat exchanger from Thermacore, is expensive and increases the size of the overall system, and thus does not fully address the problems in the art.

The present invention provides an advantage over known systems by integrating the heat exchanger function within the walls of the cabinet, whereby a lower cost, smaller package is produced. Moreover, preferred aspects of this invention provide for air-to-air heat exchange without introducing outside air (which may contain dust, humidity or pollutants) into the interior of the cabinet.

SUMMARY OF THE INVENTION

Electronic circuits which are located inside a cabinet or enclosure generate heat that must be dissipated. The present invention provides an internal heat exchanger arrangement within the cabinet that not only cools the cabinet but also provides isolation of outside (ambient) air from the air in the interior of the cabinet so that no pollutants, dust or humidity enters the interior of the cabinet where the electronics components are located.

The inventive system includes an air-to-air heat exchanger in the cabinet. The heat exchanger is preferably formed as a wall (or set of walls) separating the interior of the cabinet from the outer panels or skin of the cabinet. The heat exchanger wall provides the separation of ambient air from the air within the cabinet adjacent to the electronics. The heat exchanger wall is preferably given a folded, fin, or other such configuration to increase its surface area and facilitate heat transfer between warm air inside the enclosure and relatively cooler ambient air circulated on the exterior surface of the heat exchanger. In exemplary embodiments, the heat exchanger wall is constructed of thin material, such as sheet aluminum, to maximize heat transfer. The sheet can be very thin, almost membrane like, such as 10 mils. The heat exchanger wall has an interior surface facing the interior of the cabinet and an exterior surface facing the outer panels or skins.

A first fan arrangement (fan or set of fans) draw relatively cool ambient air through a set of openings in the bottom of the outer panels of the cabinet into an air space between the heat exchanger wall's exterior surface and the outer panels. The cool air is pulled up past the outside surface of the heat exchanger wall and exhausted out the top of the panels. A second fan arrangement (fan or set of fans) are provided inside the cabinet which draws air within the cabinet that has been warmed by the electronics and forces it through an air space provided between an inner wall of the cabinet and the inside surface of the heat exchanger walls. Heat is transferred from the warm air through the heat exchanger wall to the ambient air, flowing over the outer surface of the heat exchanger wall due to the action of the first fan arrangement. The air inside the cabinet is isolated from the ambient air by the heat exchanger wall (and by seals and other features), so that humidity, dirt and air pollutants in the ambient air stream are not pulled into the cabinet were the electronics are located.

The invention is applicable generally to enclosures that house electronic components. A detailed description of a preferred embodiment will be provided in the context of a cabinet housing electronics components for a Digital Subscriber Line Access Multiplexer (DSLAM), a networking device used to connect remotely-located computers to a packet switched network. This description is provided for purposes of illustration and not limitation. The techniques and features of the illustrated embodiment described below are applicable to cabinets housing other types of circuitry, whether in the networking or computer industries or in other industries such as medical equipment, copy machines, etc. In other words, the function of the device and the nature of the electronics in the cabinet, and the form factor or size of the cabinet, is not important.

BRIEF DESCRIPTION OF THE DRAWINGS

FIG. 5 also shows the inner wall of the cabinet and an opening in the bottom portion thereof allowing air to return to the bottom of the cabinet from a heat exchanger wall located immediately behind the inner wall.

DETAILED DESCRIPTION OF AN EXEMPLARY EMBODIMENT

Referring now generally to FIGS. 1–4, FIG. 1 is a perspective view of a cabinet 10 enclosing electronic components (see FIG. 3), showing the outer panels 12 or "skin" forming the periphery of the cabinet 10. The panels 12 include the three side panels 12A, 12B and 12C, a front door 12D which is facing away from the viewer in FIG. 1, and a top panel 12E. The side panels 12A–C include lower air intake vents 14 where relatively cooler air is introduced into the cabinet, and more particularly to narrow air gap or space that exists between the skins 12A–C and the outer surface of a plurality of air-to-air heat exchanger wall elements described below. The heat exchanger walls block ambient air from entering the interior of the cabinet where the electronic components are housed. The side walls also include upper exhaust vents 16 where relatively warmer air is removed from the cabinet.

Figure 1:
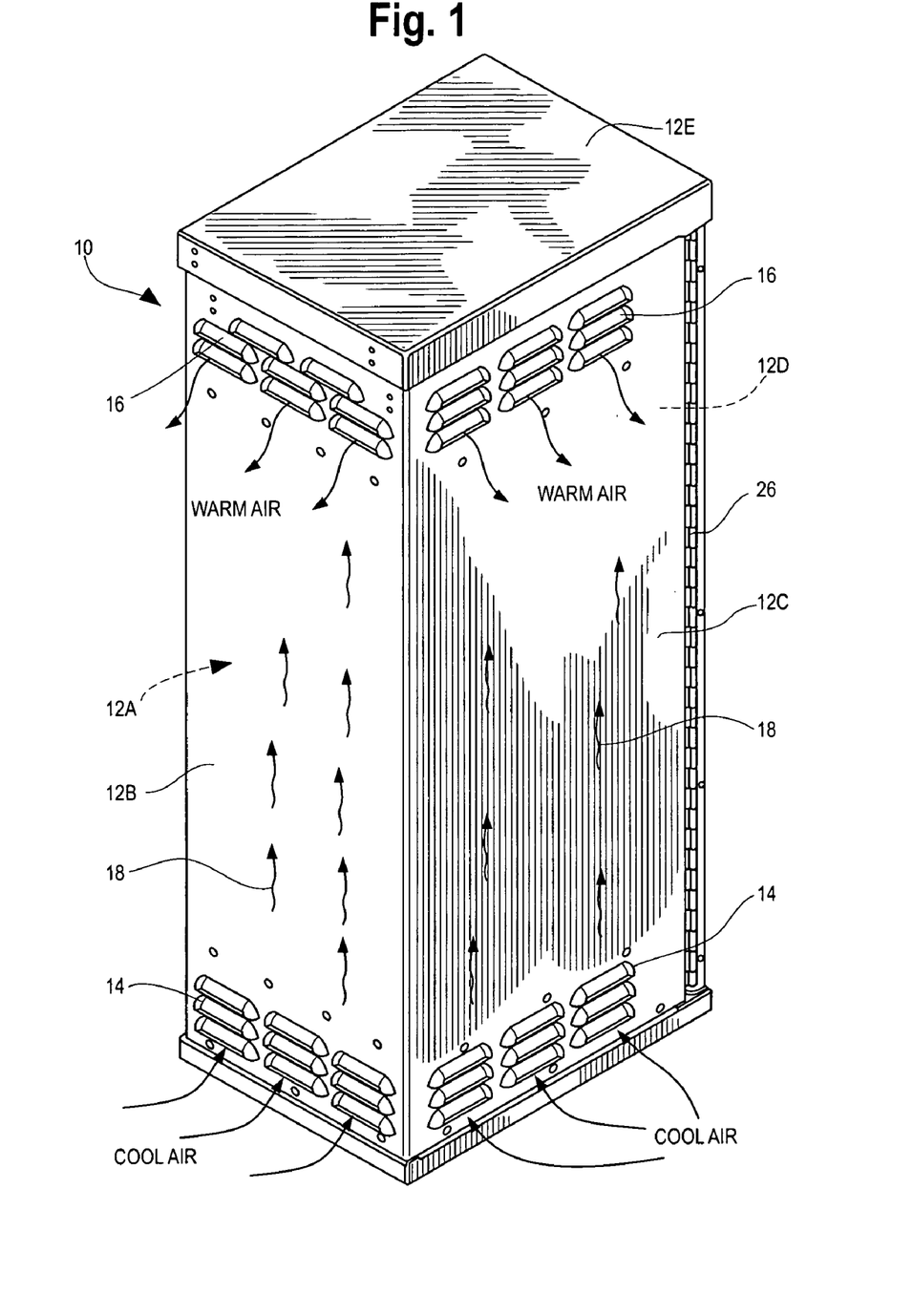
FIG. 1 is a perspective view of a cabinet enclosing electronic components, showing the outer panel or skin of the cabinet and showing the lower air intake vents where relatively cooler air is introduced into the cabinet and the upper exhaust vents where relatively warmer air is removed from the cabinet. A set of heat exchanger walls inside the cabinet provides an isolation of the interior of the cabinet where the electronics are located from the ambient air flow shown in FIG. 1.

The arrows 18 in FIG. 1 show the air flow path for ambient air. The air flow path 18 is achieved by a first fan arrangement 100 in the housing (see FIG. 5) which pulls relatively cooler ambient air into the vents 14 and into a space within the panels 12A–C and along the exterior surface 61 heat exchanger walls 60 (FIG. 6) where it is warmed and back into the environment via the upper warm air vents 16.

Figure 2:
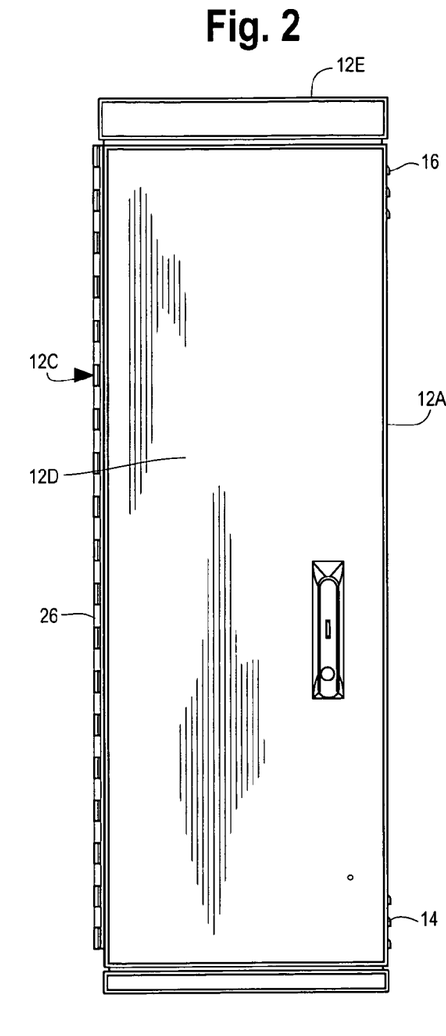
FIG. 2 is a front elevation view of the cabinet of FIG. 1.
Figure 3:
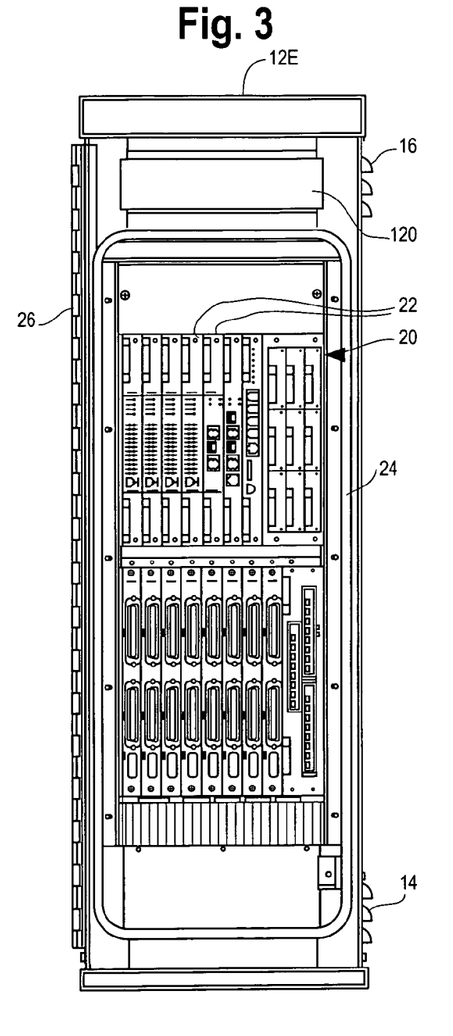
FIG. 3 is another front elevation view of the cabinet with the door shown in FIG. 2 removed, showing the electronics components inside the cabinet.
Figure 4:
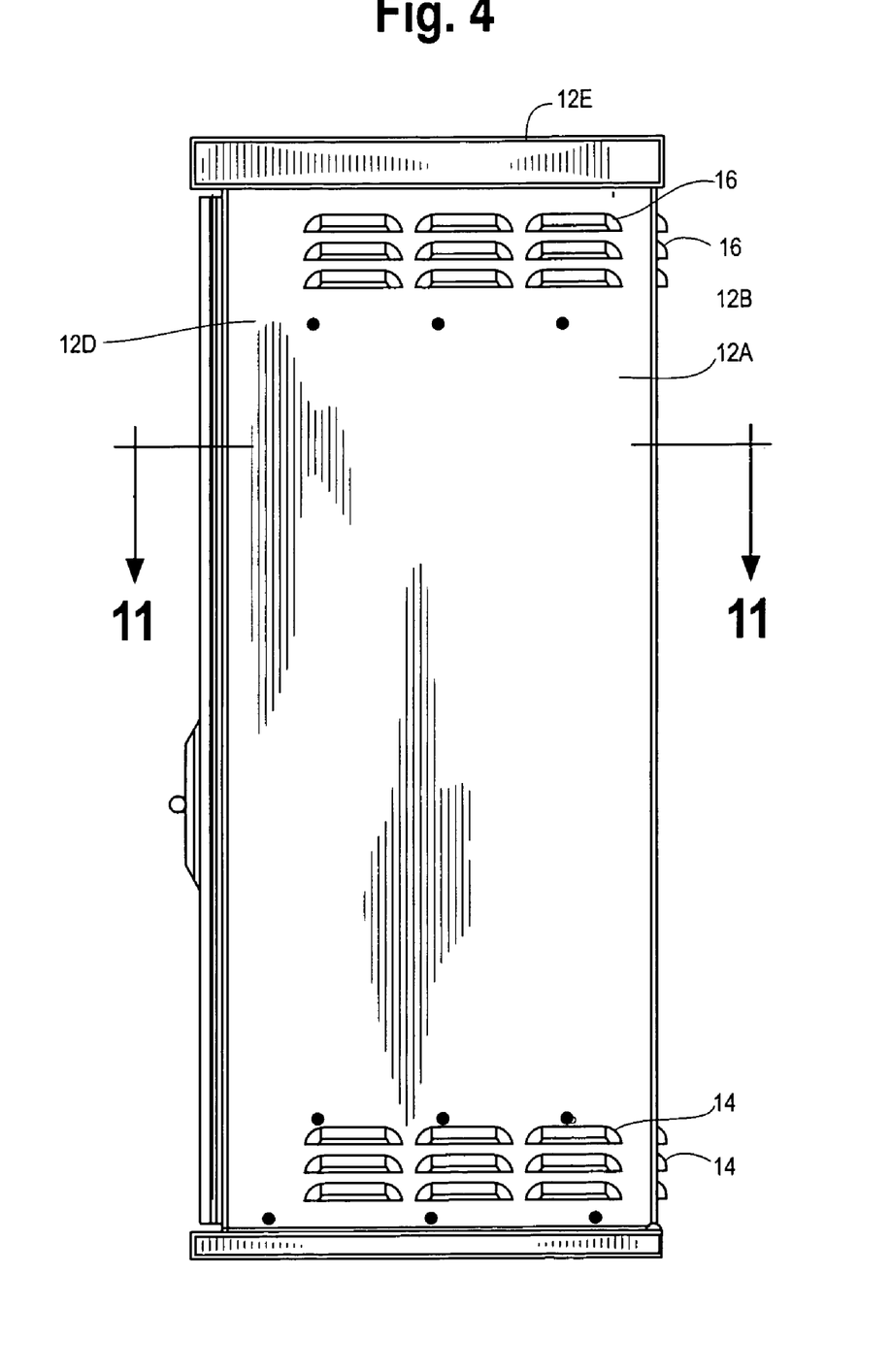
FIG. 4 is a side elevation view of the cabinet of FIG. 1.

FIG. 2 is a front elevation view of the cabinet 10 of FIG. 1, showing the front door 12D by which a user gains access to the electronics in the cabinet. FIG. 3 is another front elevation view of the cabinet 10 with the door 12D shown in FIG. 2 removed, showing the electronics components 20 inside the cabinet. FIG. 4 is a side elevation view of the cabinet of FIG. 1. The door 12D swings open via a hinge 26. When it closes, it closes tightly against a door gasket 24 shown in FIG. 3, in order to prevent ambient air from being pulled into the interior of the cabinet in the vicinity of the electronic components.

The electronics 20 in this example are a plurality of individual card modules 22, which contain semiconductor components such as integrated circuits, power supplies, memory chips, processors, and so forth which generate heat. The nature of the cards 22 is of course not important. In the present example, the cards are circuit card modules for a Digital Subscriber Line Access Multiplexer, a device used in computer networking that is sometimes placed in operation in an outdoor location.

Figure 5:
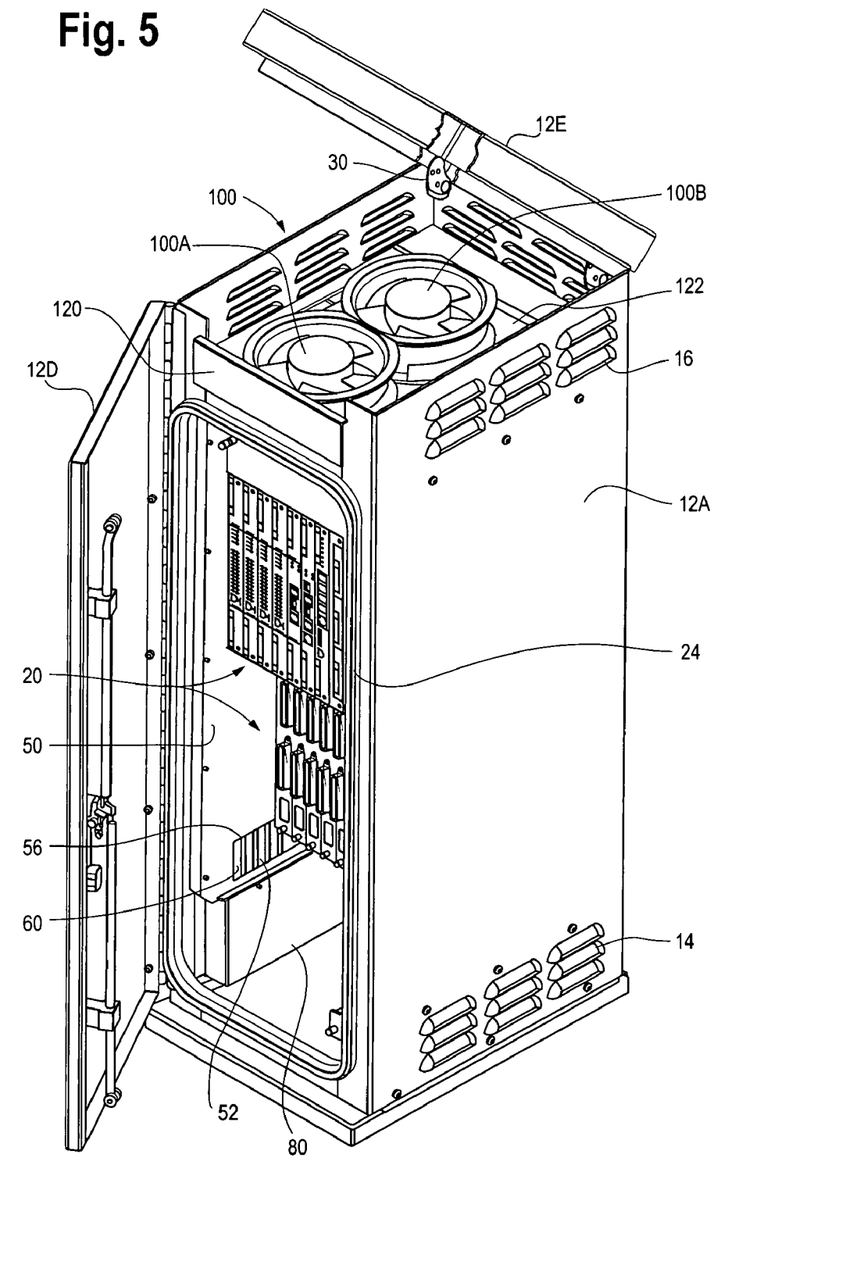
FIG. 5 is perspective view of the cabinet of FIG. 1 with the door open showing the interior of the cabinet, with the top shown partially elevated to reveal the first set of fans in the top of the cabinet which draw ambient air in the flow path shown in FIG. 1.

FIG. 5 is perspective view of the cabinet 10 of FIG. 1 with the door 12D open showing the interior of the cabinet. The top 12E has a pair of hinges 30 allowing it to raise as shown, revealing the first fan arrangement (set of fans 100A and 100B) in the top of the cabinet which draw ambient air in the flow path shown in FIG. 1 and described previously.

FIG. 5 also shows an inner wall 50 of the cabinet. A second inner wall is placed on the opposite side of the cabinet 12 inside the outer panel 12A, and a third inner wall is placed against the rear of the interior of the housing behind the electronics 20. The frames 51 for holding the electronics cards mount to the inner surface of the inner walls 50 as shown in FIG. 6.

Air-to-air heat exchanger walls 60 are placed between the inner walls 50 and the outer panels 12A–C, and between the inner wall at the rear of the cabinet and the rear panel 12B. See FIGS. 7, 8 and 9 and 11. The heat exchanger walls 60 are made from a sheet of heat conductive metal, such as sheet aluminum alloy. In a preferred embodiment, the heat exchanger walls 60 are formed with a folded or corrugated shape to increase the surface area. The heat exchanger walls 60 can be made from a thin aluminum membrane, such as a 10 mils (roughly the thickness of an aluminum beverage can). A range of between 5 and 60 mils may be suitable for many applications.

Figure 6:
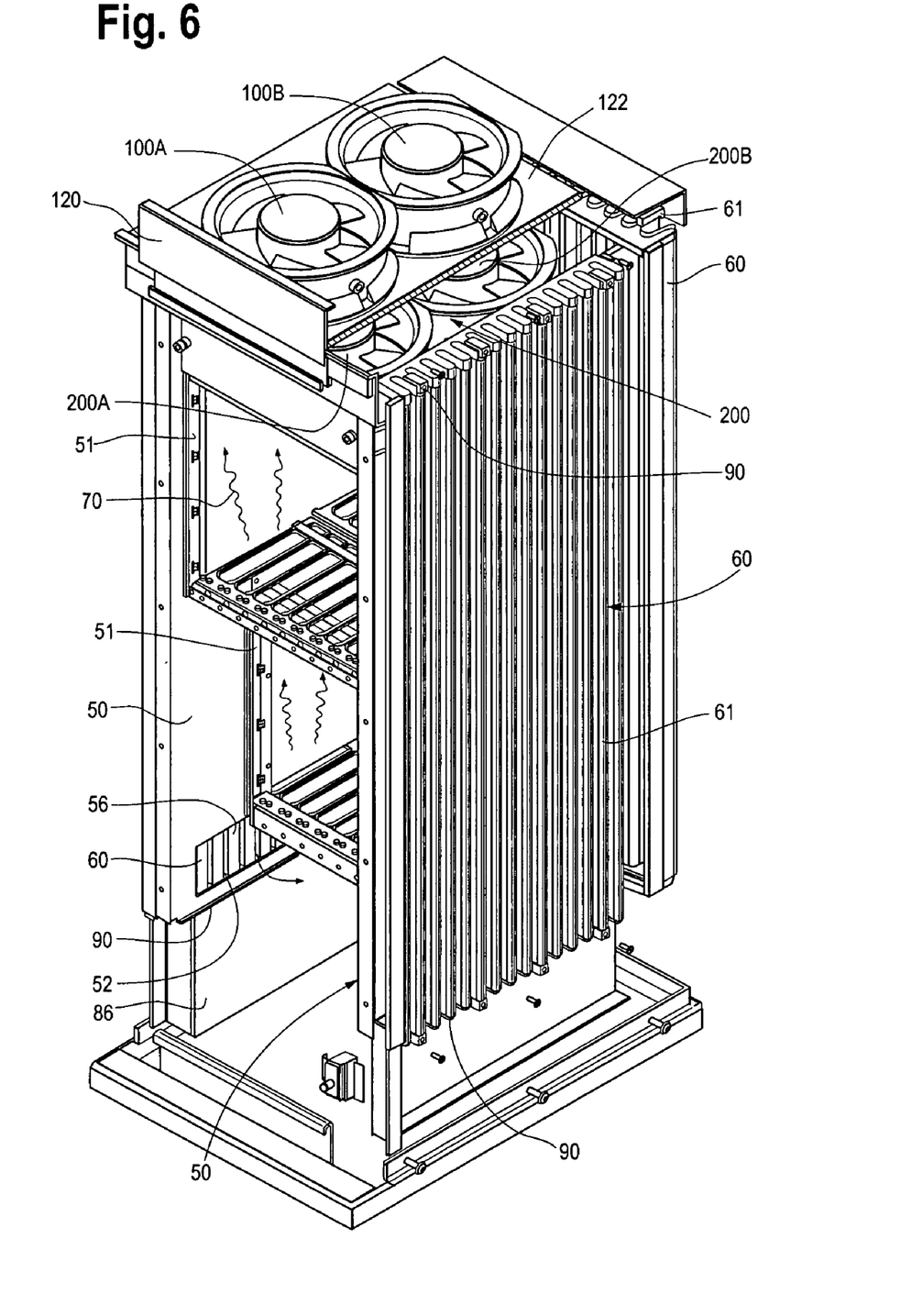
FIG. 6 shows the cabinet of FIG. 1 with the outer panels or skin of the cabinet removed to better illustrate the heat exchanger walls provided in the cabinet. An intermediate wall placed against the outside surface of the heat exchanger wall is also not shown in order to better illustrate the heat exchanger features of the cabinet.

The gap between the inside surface of the heat exchanger walls 60 and the outer (exterior) surface of the inner walls 50 forms an air space where air is circulated by a second fan arrangement 200 consisting of a pair of fans 200A and 200B (FIG. 6). In particular, the fans 200 draw warm air up as indicated by the arrows 70 in FIG. 6 from the interior of the cabinet 10 and force it outward and down an air space that exists between the interior surface 56 of the heat exchanger walls 60 and the exterior surface of the inner walls 50. The inner walls 50 have an opening 52 in the bottom portion thereof allowing return of the air flowing down the air space and re-entry into the bottom of the cabinet 10 below the electronics 20. Thus, the internal air is drawn upwards by the fans 200 through the electronics (see arrows 70 in FIG. 6) and then outwardly and down the air space between the inner walls 50 and the heat exchanger walls 60.

Figure 7:
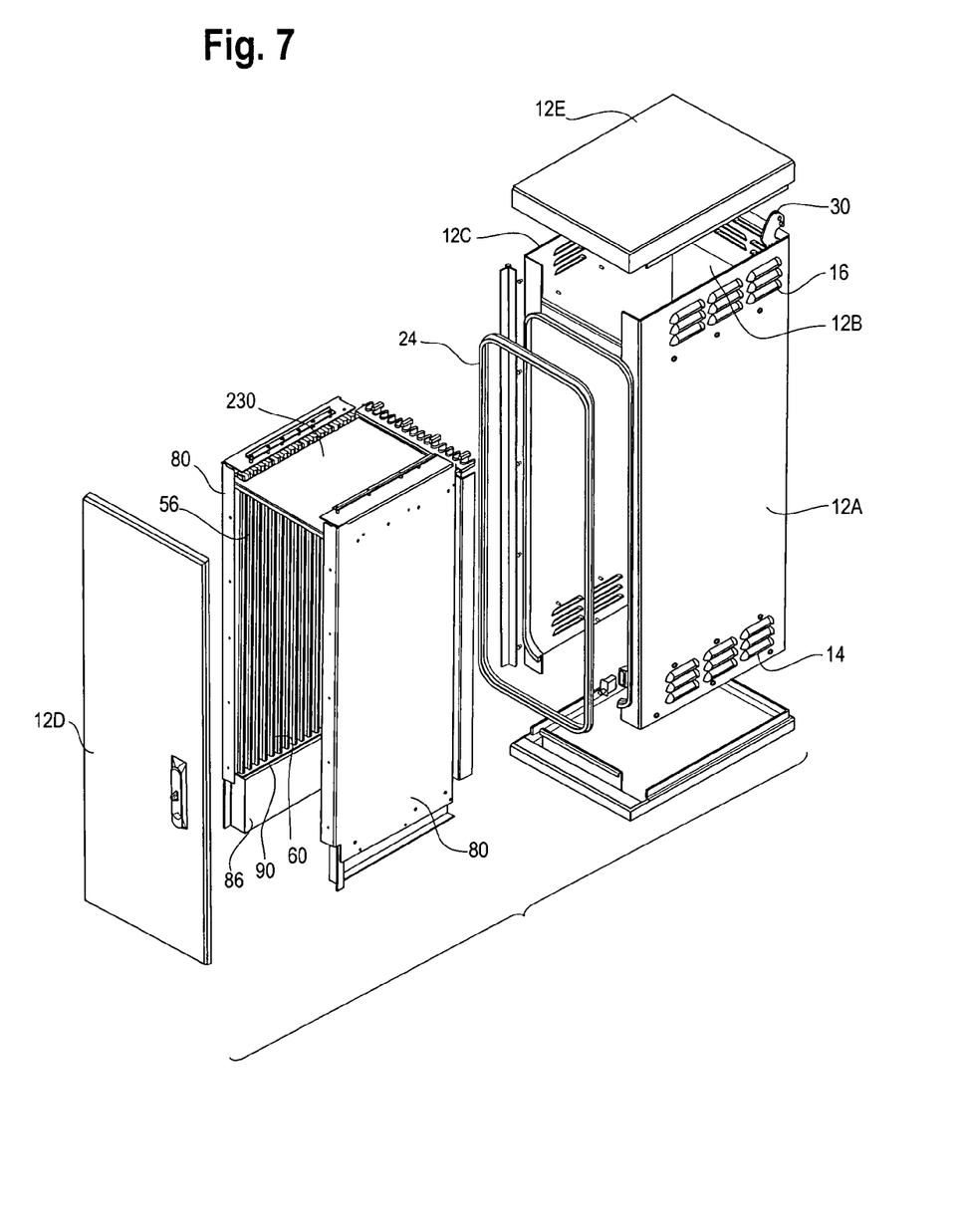
FIG. 7 is an exploded view of the cabinet showing the heat exchanger assembly and the outer panels or skin of the cabinet.
Figure 8:
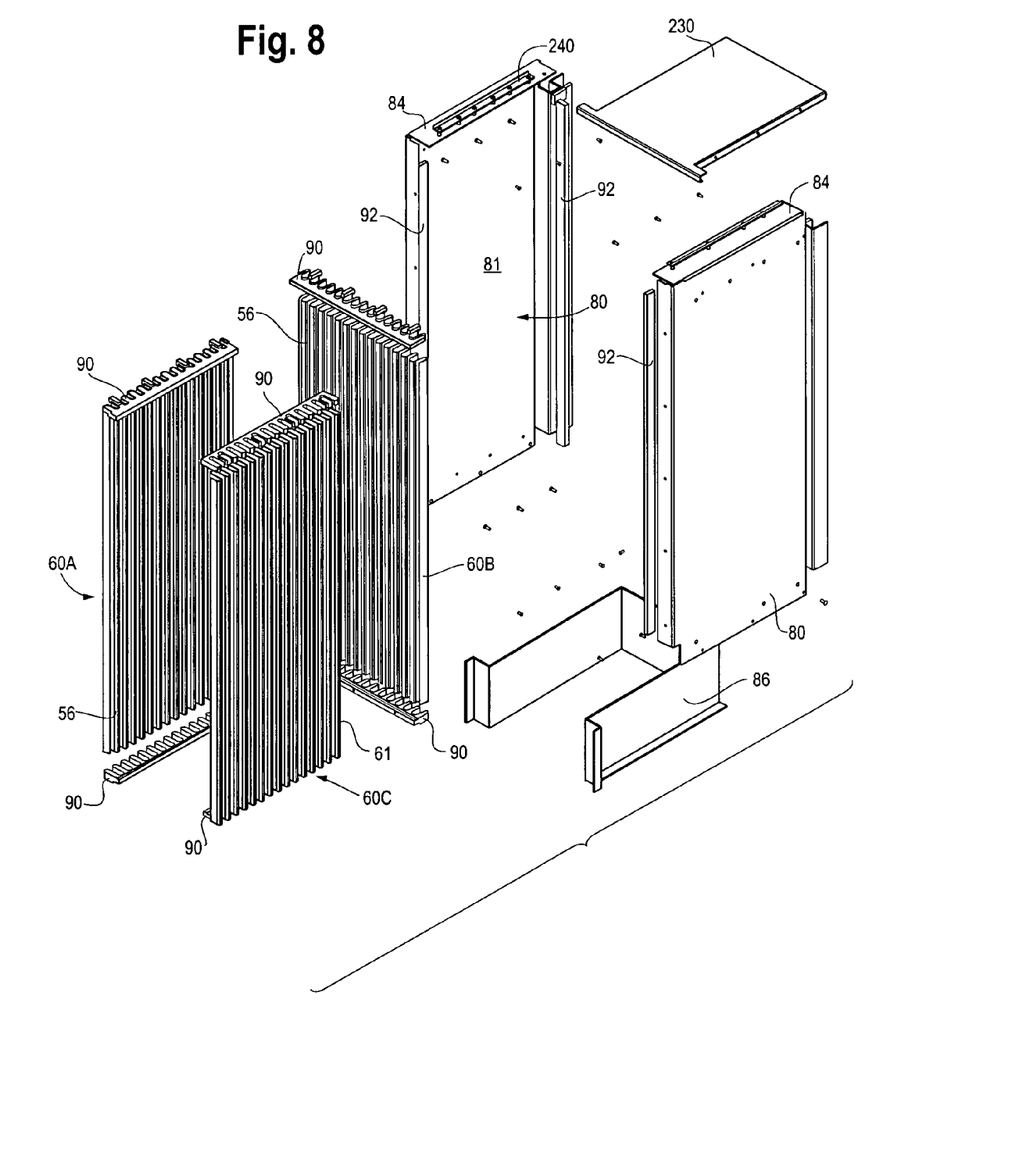
FIG. 8 is an exploded view of the heat exchanger assembly of FIG. 7 which is nested within the outer panels or skin of the cabinet.

FIG. 6 shows the cabinet of FIG. 1 with the outer panels or skin of the cabinet removed to better illustrate the three walls 60 that comprise the air-to-air heat exchanger mechanism provided in the cabinet. A pair of two intermediate walls 80 placed against the outside surface 61 of the left and right side heat exchanger walls 60 is not shown in FIG. 6 in order to better illustrate the heat exchanger wall 60 features of the cabinet. The intermediate walls 80 are shown in FIGS. 7 and 8. Due to the folded or corrugated form to the heat exchanger walls 60, the placement of the intermediate wall 80 against the exterior surface 61 of the heat exchanger wall forms an air gap or space for the ambient air to circulate by action of the fans 100A and 100B, as shown in FIG. 1. Thus, in the illustrated embodiment, it is possible to use the inside surface of one or more of the panels 12 (such as inside surface of panel 12B, or to use the inside surface of the intermediate walls 80 for the sides as shown in FIGS. 7 and 8, to form the passage on the outside of the heat exchanger wall 60.

FIG. 6 also shows an end cap seal piece 90, which may be made from metal, which is placed at the top and bottom edges of the heat exchanger walls 60. The pieces 90 fasten to the inner wall 50 and either the intermediate wall 80 or the back panel 12. The heat exchanger walls 60 and bottom seal pieces 90 are placed on top of a bottom wall 86 as shown in FIGS. 6–8. The purpose of the end cap seal piece 90 is to seal off half of the corrugated feature of the heat exchanger wall 60 so that when the fans 100 and 200 operate the ambient air does not enter the passage on the inside surface of the heat exchanger wall, and also that the air internal to the cabinet does not pass over the bottom or top edges of the heat exchanger wall.

FIG. 6 also shows the fans 100A and 100B are mounted to a base 122. The base 120 has a front panel 120 which allows a user to slide the fan assembly 100A/100B/122 into position.

FIG. 7 is an exploded view of the cabinet showing the heat exchanger 60 and intermediate wall 80/heat exchanger 60 assembly and the outer panels 12 of the cabinet. In FIG. 7, the inner wall 50 of FIG. 6 is not shown in order to better illustrate the inner surface 56 of the heat exchanger wall 60. The intermediate walls 80 fasten directly against the panels 12A and 12C, so the flow path for ambient air shown in FIG. 1 flows inside the intermediate walls 80 in the space between the inside surface 81 (FIG. 8) of the intermediate walls 80 and the corrugated surfaces of the heat exchanger wall peripheral surface 61 shown in FIGS. 6 and 8. See also FIG. 11.

FIG. 7 also shows a panel 230 placed at the level of the upper edge of the heat exchanger walls 60. The fans 200A and 200B of FIG. 6 are mounted below the panel 230 and blow warm air from the interior of the cabinet upwardly. The air hits the under side of the panel 230 and is forced laterally where it returns via an opening at the top of the inner wall 50, down the space between the heat exchanger wall 60 and the inner wall 50, through opening 52 (FIG. 5). The air returns below the electronics via the opening 52 shown in FIG. 5.

Figure 9:
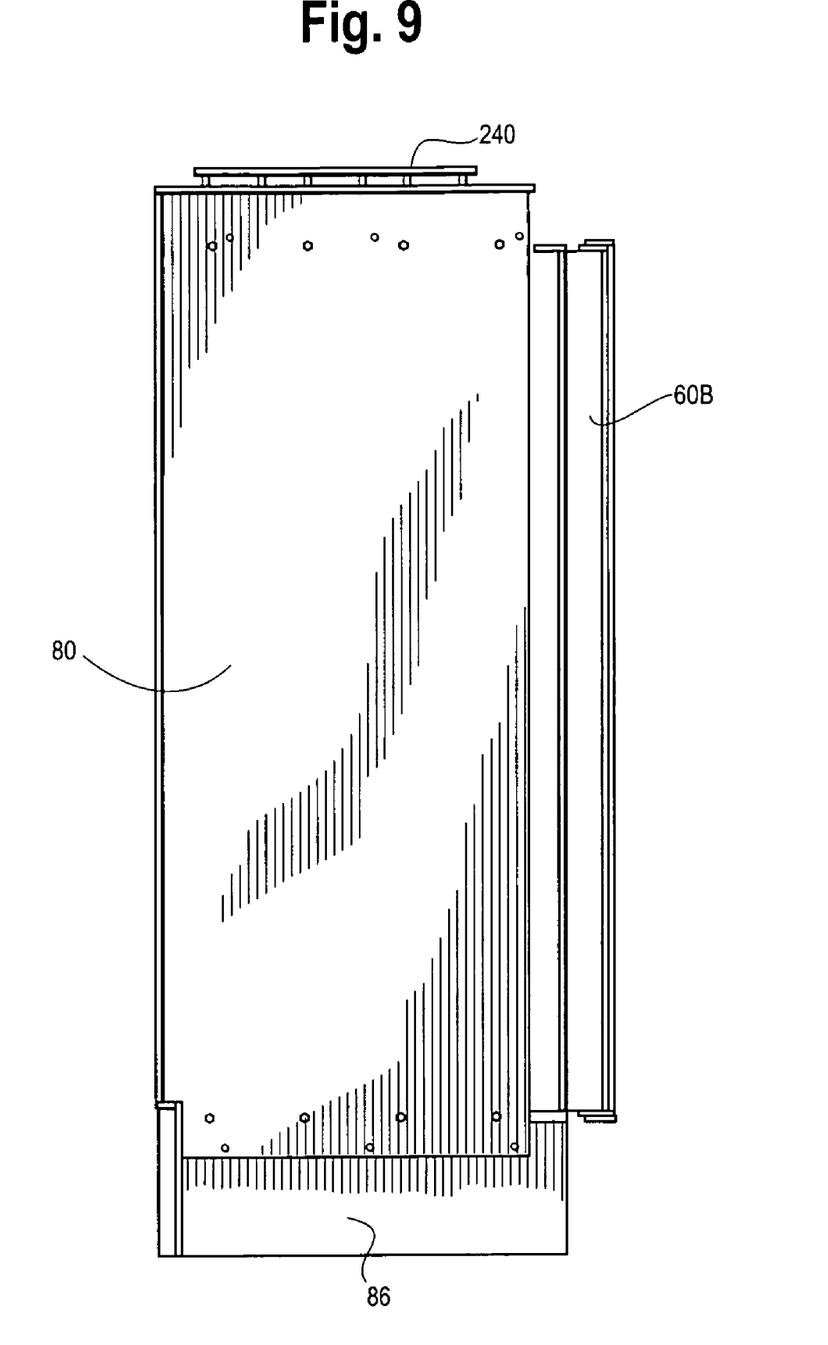
FIG. 9 is a side view of the heat exchanger assembly of FIG. 8.

FIG. 8 is an exploded view of the heat exchanger assembly of FIG. 7. The heat exchanger assembly includes the three heat exchanger walls 60A, 60B, 60C, the end caps 90, and the outer intermediate walls 80 positioned exteriorly with respect to the heat exchanger walls 60. Note that there are two intermediate walls 80 on opposite sides of the assembly, there is no intermediate wall on the rear heat exchanger wall 60B opposite the door. Including a wall in this portion would be optional. As noted above, the intermediate walls 80 abut the outer panels or skin for the cabinet as shown in the cross-section of FIG. 11. The intermediate walls 80 include an upper flange 84 which includes guides 240 for assisting the user in sliding in the base 122 for the first pair of fans 100 (FIG. 6). FIG. 9 is a side view of the heat exchanger assembly of FIG. 8 in an assembled condition.

Figure 10:
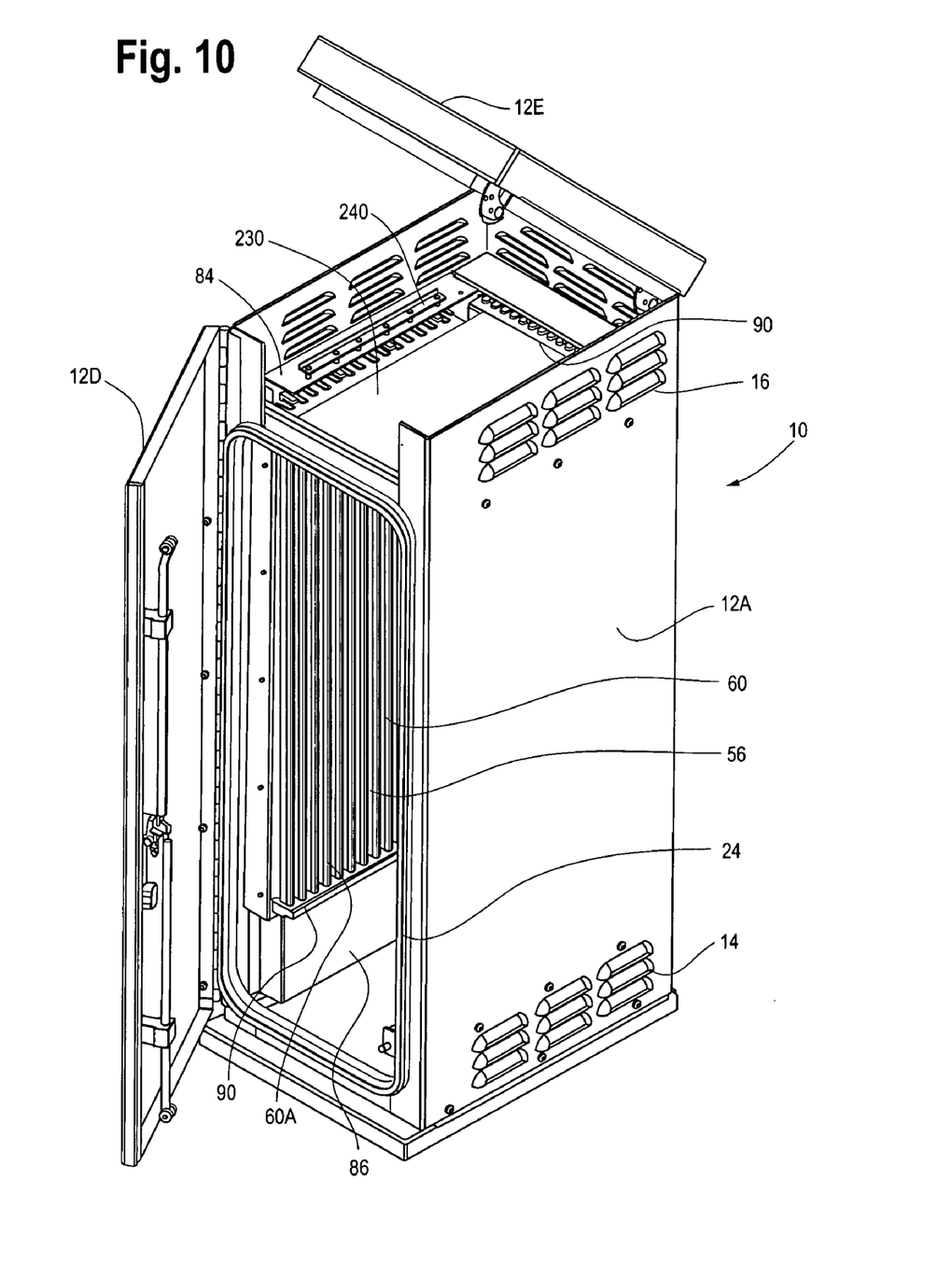
FIG. 10 is a perspective view of the cabinet of FIG. 1 with the top open and first set of fans removed in order to better illustrate the features in the top of the cabinet; the inner wall shown in FIG. 5 placed against the inside surface of the heat exchanger wall is also removed in this figure, as are the electronics, in order to better illustrate the construction of the enclosure.

FIG. 10 is a perspective view of the cabinet 10 of FIG. 1 with the top panel 12E open and first set of fans 100 and base 120 removed in order to better illustrate the features in the top of the cabinet; and in particular the panel 230, the end cap seal pieces 90 and the guides 240. The inner wall placed against the inside surface 56 of the heat exchanger wall 60 is also removed in this Figure, as are the electronics, in order to better illustrate the construction of the enclosure.

Figure 11:
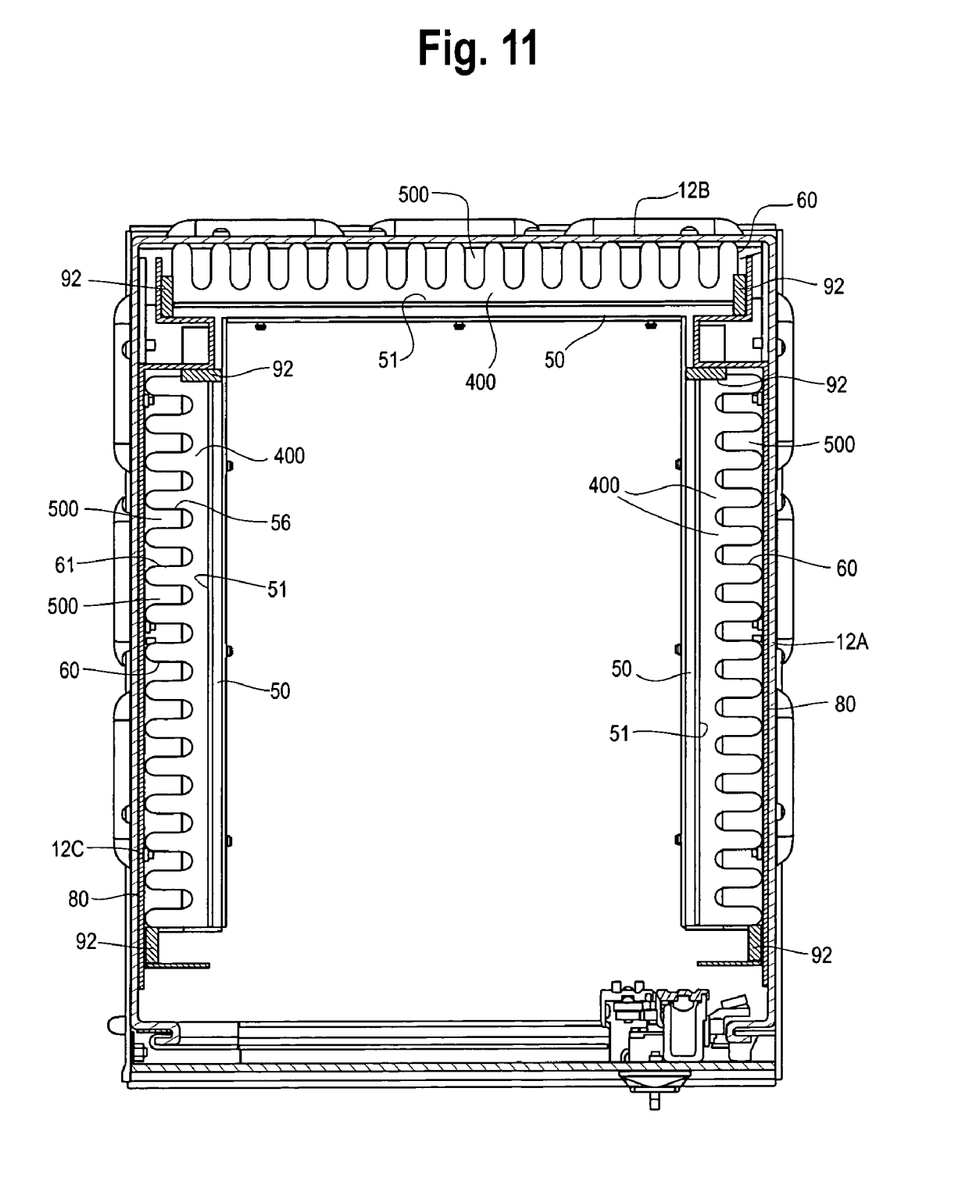
FIG. 11 is a cross sectional view of the cabinet along the lines 11—11 of FIG. 4.

FIG. 11 is a cross sectional view of the cabinet along the lines 11—11 of FIG. 4. FIG. 11 shows the air space 400 formed between the inner surface 56 of the heat exchanger 60 and the exterior surface 51 of the inner wall 50. As warm air travels down these passages adjacent to the heat exchanger 60, heat is conducted through the heat exchanger walls 60 to the ambient air flowing upwards in the passages 500 between the outer surface 61 of the heat exchanger 60 and the intermediate wall 80 and rear panel 12B.

FIG. 11 also shows foam strips or baffles 92 which block ambient air from entering the interior of the cabinet. As will be appreciated from the drawings, the strips 92 and end cap seal pieces 90 prevent ambient air from leaking around the edges of the heat exchanger walls 60 to help seal the interior from the ambient air.

The isolation of the interior of the cabinet from the environment, by the heat exchanger walls and the seal members described above, helps keep dust, humidity, pollutants, and any foreign matter from entering the interior of the cabinet 10 in the vicinity of the electronics 20. The cabinet design is thus suitable for applications where the cabinet is installed out-of-doors.

Figure 12:
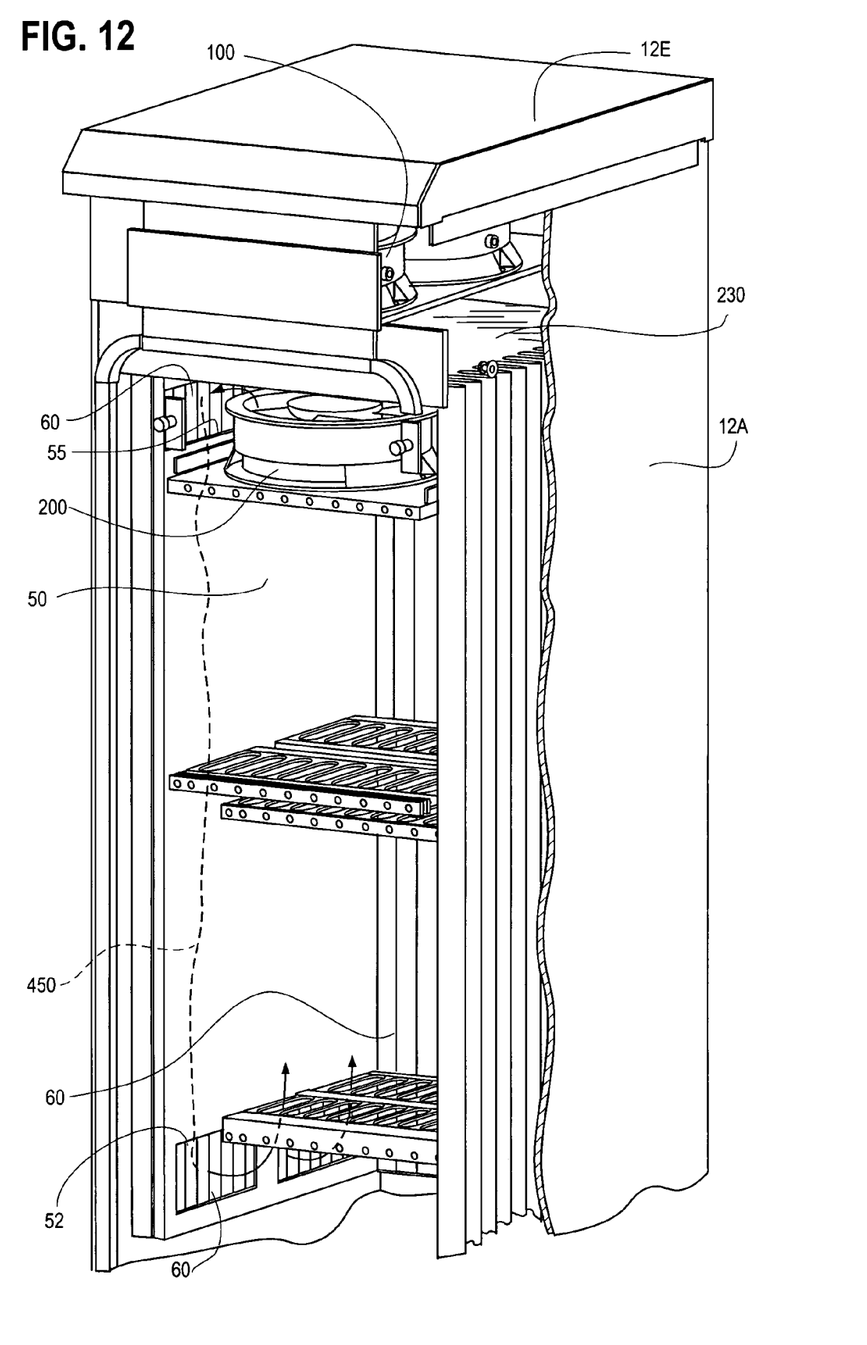
FIG. 12 is a perspective view of the inner wall, heat exchanger wall and second fan arrangement showing the flow of air internal to the cabinet.

FIG. 12 is a perspective view of the inner wall 50, heat exchanger wall 60 and fan 200 arrangement showing the flow of air internal to the cabinet. The inner wall 50 has a second opening 55 at the top. As the fan 200 blows air upwards, the air hits the underside of the panel 230 (FIGS. 8, 10), where it is forced laterally into the opening 55 and down behind the inner walls 50, where it returns to the base of the cabinet below the electronics via the opening 52. The inner wall on the rear of the cabinet is removed to show the heat exchanger wall 60. The flow of air is indicated by arrows 450.

From the foregoing, it will be appreciated that an enclosure or cabinet 10 housing electronic components has been described with an integral heat exchanger arrangement 60 located within the enclosure 10. The cabinet comprises:

a set of panels 12 forming an outer peripheral skin for the enclosure:

at least one air-to-air heat exchanger wall 60 placed within the panels 12 having an interior surface 56 and an exterior surface 61 (see FIG. 11);

a first fan arrangement 100 for circulating ambient air into a space 500 within the panels and along the exterior surface 61 of the heat exchanger wall 60 and back into the environment (see FIG. 11, the upper vents 16 of FIG. 1);

a second fan arrangement 200 (FIGS. 6, 12) for circulating air contained within the enclosure against the interior surface 56 of the heat exchanger wall, wherein heat present in the air within the enclosure is transferred through the heat exchanger wall 60 to the ambient air circulated by the first fan arrangement 100; and an inner wall 50 placed adjacent to the interior surface 56 of the heat exchanger wall 60, the space 400 between the inner wall and the heat exchanger wall forming a space 400 for the air within the interior of the enclosure to circulate by the second fan 200 along the interior surface 56 of the heat exchanger wall;

wherein the heat exchanger wall 60 provides a barrier isolating the ambient air from the air within the enclosure preventing dust, humidity and pollutants to enter into the interior of the cabinet in the space surrounding the electronic components.

The principles of this invention are applicable to other form factors, sizes and configurations of cabinets housing electronic components. The heat exchanger wall could be placed in a variety of configurations. In a typical embodiment, the enclosure or cabinet 10 has a rectangular configuration with four sides, a top and a bottom. For example the enclosure could have two or three or even more heat exchanger walls placed against the sides, top and/or bottom.

In the illustrated embodiments, the first and second fan arrangements 100 and 200 consist of a pair of fans each. This is not necessary and one, two or more fans could be used. Two are shown in the illustrated embodiment so that in the event that one fan fails, the remaining fan will provide cooling; only one is in fact required.

The folded or corrugated form to the heat exchanger wall is not absolutely necessary, it be dependent upon its surface area, the amount of cooling required, and other factors. While sheet aluminum is preferred, the thickness of the aluminum can be between 10 and 20 thousands of an inch in preferred embodiments to maximize heat transfer. Other thicknesses are of course possible. Other materials are also possible.

As noted earlier, the nature of the electronics is not important. The invention is particularly useful for housing electronic components for devices used in computer networking, including such devices installed out-of-doors. Specific examples of devices which can incorporate the invention include computers, servers, routers, remote access servers, DSL access multiplexers, and a switches used in telephony and data networking.

From the foregoing, it will also be appreciated that a method has been described for cooling an enclosure housing electronic components. The method includes the following steps:

a) drawing ambient air into an air passage 500 formed within the enclosure between the exterior of the enclosure and an outer surface 61 of an air-to-air heat exchanger 60 placed within the interior of the enclosure and directing the ambient air back into the environment (see FIGS. 1 and 11);

b) separating the ambient air from air internal to the enclosure in the vicinity of the electronic components by means of the heat exchanger wall 60 (see FIG. 11);

c) circulating relatively warm air internal to the enclosure against the inner surface 56 of the heat exchanger wall 60, whereby heat is transferred from the air internal to the enclosure to the ambient air (see FIGS. 6, 11 and 12);

d) wherein the step c) of circulating is performed by a fan 200 directing air into an air space 400 formed between the inner surface 56 of the heat exchanger 60 and an interior wall 50 of the enclosure placed adjacent to the heat exchanger 60 and between the heat exchanger and the electronic components (see FIGS. 3, 5 and 6).

In the preferred embodiment of the method, the enclosure includes a set of panels 12 defining the periphery of the enclosure and wherein step a) is performed by a first fan arrangement 100 which is placed within panels, as shown in FIG. 5.

Variation from the illustrated embodiments is possible without departure from the scope of the invention. The scope is to be determined by reference to the appended claims, interpreted in view of the foregoing.

The invention claimed is:

1. An enclosure housing electronic components with an integral heat exchanger arrangement located within the enclosure, comprising:

a set of panels forming an outer peripheral skin for the enclosure;

at least one air-to-air heat exchanger wall placed within the panels having an interior surface and an exterior surface;

a first fan arrangement for circulating ambient air into a space within the panels and along the exterior surface of the heat exchanger wall and back into the environment;

a second fan arrangement for circulating air contained within the enclosure against the interior surface of the heat exchanger wall, wherein heat present in the air within the enclosure is transferred through the heat exchanger wall to the ambient air circulated by the first fan arrangement, the heat generated by the electronic components within the enclosure; and an inner wall placed adjacent to the interior surface of the heat exchanger wall, the space between the inner wall and the heat exchanger wall forming an air space for the air within the interior of the enclosure to circulate by the second fan along the interior surface of the heat exchanger wall;

wherein the heat exchanger wall provides, at least in part, a barrier isolating the ambient air from the air within the enclosure preventing dust, humidity and pollutants to enter into the interior of the enclosure in the space surrounding the electronic components;

wherein the heat exchanger wall comprises a heat conductive material having a corrugated configuration and having a top edge and a bottom edge, and wherein the enclosure further comprises end cap seals placed adjacent to the top and bottom edges of the heat exchanger wall to prevent ambient air from being drawn into the interior of the enclosure by the action of the second fan arrangement.

2. The enclosure of claim 1, wherein the enclosure has a rectangular configuration with four sides, a top and a bottom, and wherein the enclosure further comprises at least two heat exchanger walls placed against at least two of the four sides, top and bottom.

3. The enclosure of claim 1, wherein the enclosure has a rectangular configuration with four sides, a top and a bottom, and wherein the enclosure further comprises three heat exchanger walls placed against to three of the four sides, top and bottom.

4. The enclosure of claim 1, wherein the first fan arrangement and the second fan arrangement comprise a pair of fans.

5. The enclosure of claim 1, wherein said heat exchanger wall has a thickness of between about 5 and about 60 thousands of an inch.

6. The enclosure of claim 1, wherein the enclosure houses electronic components functioning as a device used in computer networking.

7. The enclosure of claim 1, wherein the device is selected from the group of devices consisting of a computer, a server, a router, a remote access server, a DSL access multiplexer, and a switch.

8. A method for cooling an enclosure housing electronic components due to heat generated by the electronic components, comprising the steps of:
  a) drawing ambient air into an air passage formed within the enclosure and against an outer surface of an air-to air heat exchanger placed within the interior of the enclosure and directing the ambient air back into the environment;
  b) separating the ambient air from air internal to the enclosure in the vicinity of the electronic components within the enclosure by means of the heat exchanger;
  c) circulating relative warm air internal to the enclosure heated by the electronic components against the inner surface of the heat exchanger, whereby heat is transferred from the air internal to the enclosure to the ambient air;
  d) wherein the step c) of circulating is performed by a fan directing air into an air space formed between the inner surface of the heat exchanger and an interior wall of the enclosure placed adjacent to the heat exchanger and between the heat exchanger and the electronic components;
  wherein the heat exchanger comprises a heat conductive material having a corrugated configuration and having a first edge and an opposite second edge, and wherein the method further comprises the step of affixing an end cap seal adjacent to the first and second edges of the heat exchanger to prevent ambient air from being drawn into the interior of the enclosure.

9. The method of claim 8, wherein the enclosure includes a set of panels defining the periphery of the enclosure and wherein step a) is performed by a first fan arrangement placed within panels.

10. The method of claim 8, wherein the enclosure has a rectangular configuration with four sides, a top and a bottom, and wherein the heat exchanger comprises at least two heat exchanger walls placed against at least two of the four sides, top and bottom.

11. The method of claim 8, wherein the enclosure has a rectangular configuration with four sides, a top and a bottom, and wherein the heat exchanger further comprises three heat exchanger walls placed against three of the four sides, top and bottom.

12. The method of claim 8, wherein the heat exchanger has a thickness of between about 5 and about 60 thousands of an inch.

13. The method of claim 8, wherein the enclosure houses electronic components functioning as a device used in computer networking.

14. The method of claim 13, wherein the device is selected from the group of devices consisting of a computer, a server, a router, a remote access server, a DSL access multiplexer, and a switch.

* * * * *